United States Patent [19]
Shelor

[11] Patent Number: 5,821,746
[45] Date of Patent: Oct. 13, 1998

[54] APPARATUS FOR TESTING MULTIPLE MAGNETIC RECORDING HEADS

[75] Inventor: Rick Shelor, San Diego, Calif.

[73] Assignee: Phase Metrics, Inc., San Diego, Calif.

[21] Appl. No.: 950,463

[22] Filed: Oct. 15, 1997

Related U.S. Application Data

[63] Continuation of Ser. No. 629,996, Apr. 9, 1996, abandoned.

[51] Int. Cl.$^6$ .......................... G01R 33/12; G01R 31/00; G11B 5/455
[52] U.S. Cl. .......................... 324/210; 324/228; 324/262; 324/758; 324/761
[58] Field of Search .......................... 324/202, 210–212, 324/228, 261, 262, 263, 537, 538, 757, 758, 759, 761, 764, 765; 29/593, 603.09, 603.1

[56] References Cited

U.S. PATENT DOCUMENTS

| | | | |
|---|---|---|---|
| 3,617,874 | 11/1971 | Forster | 324/263 X |
| 3,710,235 | 1/1973 | Barrager et al. | 324/210 |
| 3,806,800 | 4/1974 | Bove et al. | 324/538 |
| 3,949,295 | 4/1976 | Moorshead | 324/760 |
| 4,414,507 | 11/1983 | Chen | 324/210 |
| 4,465,974 | 8/1984 | Sparks | 324/202 X |
| 4,514,687 | 4/1985 | Van Husen | 324/202 X |
| 4,853,633 | 8/1989 | Matsumoto | 324/210 |
| 4,884,027 | 11/1989 | Holderfield et al. | 324/765 |
| 5,003,251 | 3/1991 | Fuoco | 324/759 |
| 5,285,948 | 2/1994 | Rupp et al. | 324/210 X |
| 5,589,771 | 12/1996 | Chur | 324/212 |

FOREIGN PATENT DOCUMENTS

| | | | |
|---|---|---|---|
| 150264 | 5/1994 | Japan | 324/210 |

*Primary Examiner*—Gerard R. Strecker
*Attorney, Agent, or Firm*—Blakely Sokoloff Taylor & Zafman

[57] ABSTRACT

A test apparatus for testing a plurality of magnetic recording heads. The apparatus includes a tool which supports a bar that contains a number of individual magnetic recording heads. Alternatively, the tester may contain a tool which supports a plurality of individual sliders. The tool locates the heads within a magnetic field emanating from a coil wound magnet. The magnet has a length and permeability that provides a uniform magnetic field for each slider in the entire bar. The test apparatus includes a probe card that has a plurality of probe needles which make simultaneous contact with the bonding pads of each head. The needles are coupled to a test circuit that applies a constant current to the magnetic recording heads and measure a change in voltage as a function of a varying magnetic field. The tester can sequentially test the heads without spatially moving the bar, thereby minimizing the test cycle time of testing the heads. Alternatively, the tester may test two or more of the heads simultaneously.

6 Claims, 3 Drawing Sheets

APPARATUS FOR TESTING MULTIPLE MAGNETIC RECORDING HEADS

This is a Continuation Application of application Ser. No. 08/629,996, filed Apr. 9, 1996 now abandoned.

BACKGROUND OF THE INVENTION

1. Field Of The Invention

The present invention relates to an apparatus for testing magnetic recording heads.

2. Description Of Related Art

Magnetic recording heads are used in hard disk drives to magnetically record information on a rotating disk. Magnetic heads are typically constructed on a wafer that is sliced into separate rows or bars. Each bar has a number of individual recording heads. The individual heads are eventually sawed from the bars into elements called sliders and later assembled to a head gimbal assembly (HGA) of a hard disk drive.

Each bar of heads is typically tested before being sawed into individual components to insure that the magnetic heads comply with manufacturing specifications. For example, the magnetic heads may have a magneto-resistive (MR) element that has a resistance that will change with a varying magnetic field. MR heads can be tested by providing a constant current to a magnetic head, exposing the head to a time varying magnetic flux and measuring the change in voltage of the MR device. The intensity of the magnetic field is typically varied to obtain a number of data points for each head.

The heads are typically manually tested by placing an individual head in a magnetic field generated by Helmholtz coils. Manually testing individual heads increases the test cycle and ultimate cost of producing the parts. It would be desirable to provide an apparatus and technique that reduces the cycle time required to test magnetic recording heads and the cost of mass producing the heads.

After the bars are sawed, the individual magnetic recording heads are again tested for various characteristics including the flying height created by the air bearing surface of the head. Non-conforming heads are sometimes re-polished to comply with manufacturing specifications. The re-polished heads are again tested within a magnetic tester. Each head has an etched serial number to identify the part. To keep track of the parts, the sliders are held under a microscope and visually inspected to read the serial numbers. The manual reading operation is time consuming and prone to human error. Additionally, the individual components are typically manually handled with tweezers that may damage the head. It would be desirable to provide a test apparatus that can both scan the serial number and electrically test individual magnetic recording heads in a manner that does not damage the parts.

SUMMARY OF THE INVENTION

The present invention is a test apparatus for testing a plurality of magnetic recording heads. The apparatus includes a tool which supports a bar that contains a number of individual magnetic recording heads. Alternatively, the tester may contain a tool which supports a plurality of individual sliders. The tool locates the heads within a magnetic field emanating from a coil wound magnet. The magnet has a length and permeability that provides a uniform magnetic field for each slider in the entire bar. The test apparatus includes a probe card that has a plurality of probe needles which make simultaneous contact with the bonding pads of each head. The needles are coupled to a test circuit that applies a constant current to the magnetic recording heads and measures a change in voltage as a function of a varying magnetic field. The tester can sequentially test the heads without spatially moving the bar, thereby minimizing the test cycle time of testing the heads. Alternatively, the tester may test two or more of the heads simultaneously.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
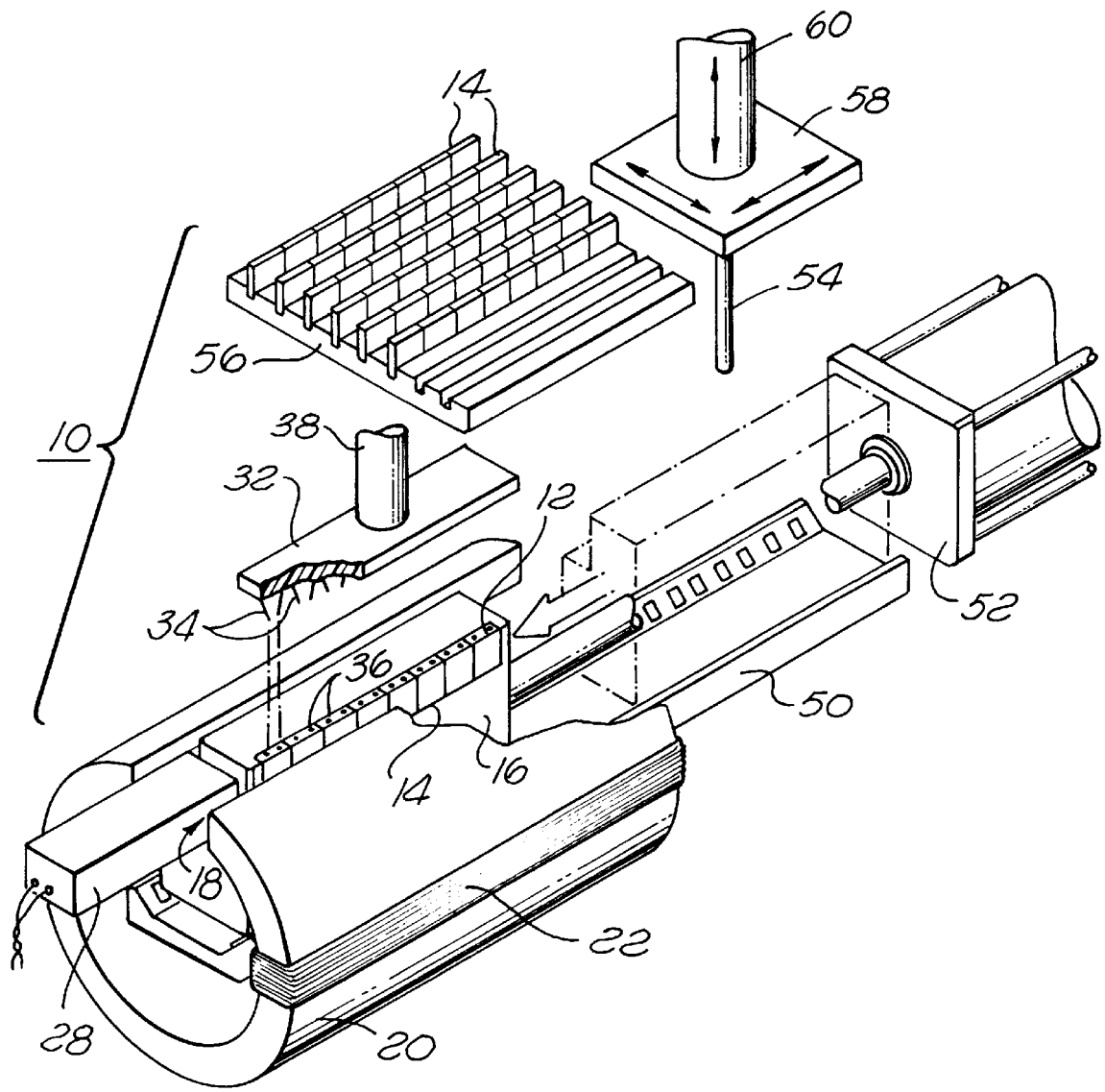
FIG. 1 is a perspective view of a magnetic recording head tester of the present invention.
Figure 2:
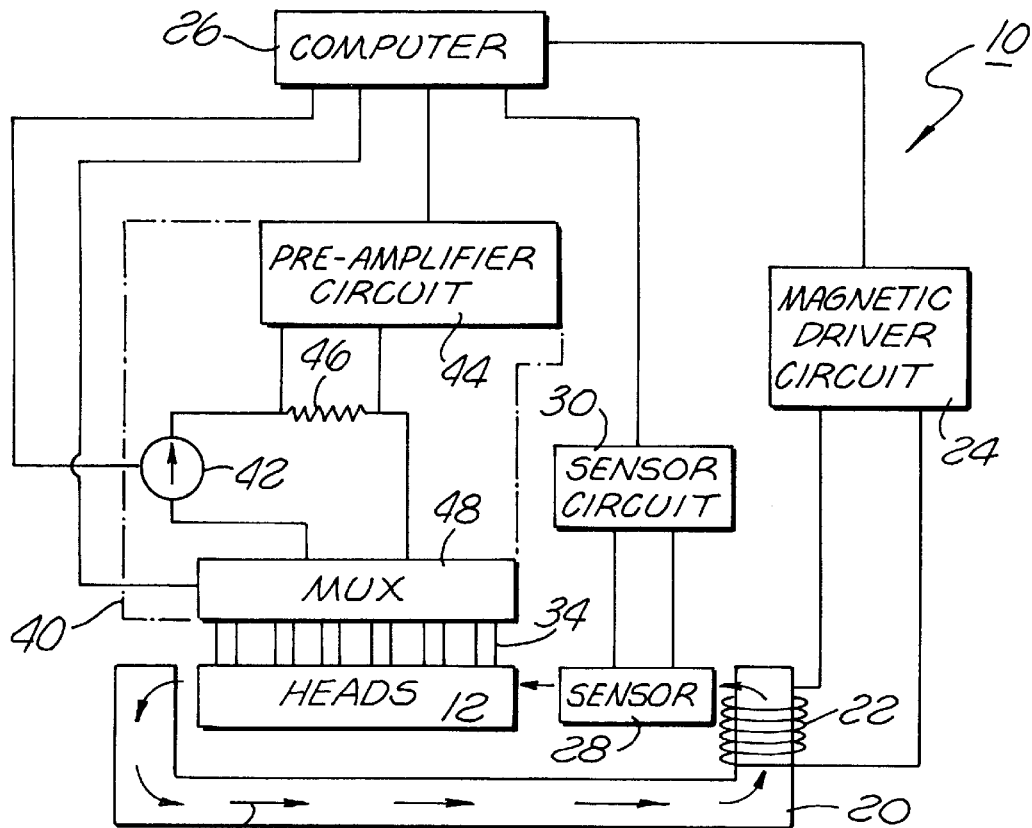
FIG. 2 is a schematic of the electrical circuit of the tester.
Figure 3A:
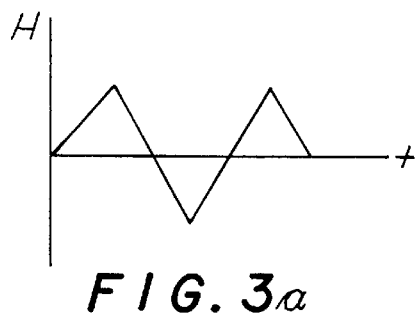
FIGS. 3a–d are graphs showing waveforms provided to the magnetic driver of the tester.
Figure 3C:
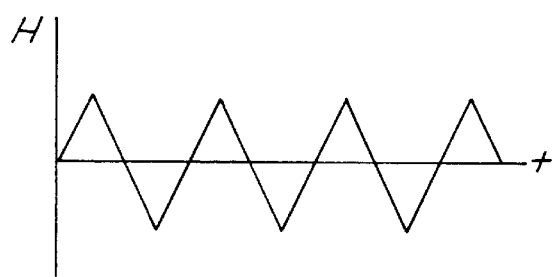
Figure 3B:
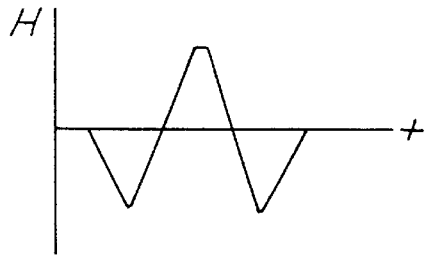
Figure 3D:
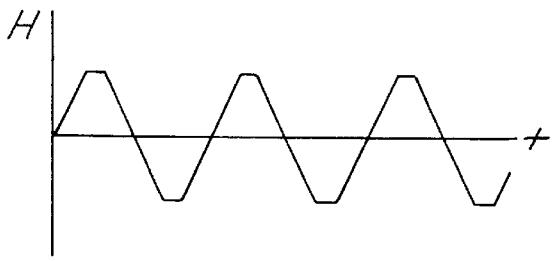

Referring to the drawings more particularly by reference numbers, FIGS. 1 and 2 show a magnetic recording head tester 10 of the present invention. The tester 10 is used to test the magnetic characteristics of a plurality of magnetic recording heads 12 located within a bar 14. The magnetic recording heads 12 are typically devices which have a magneto-resistive element that changes resistance with a varying magnetic field. A constant current is provided to the MR head and the change in voltage is measured in conjunction with a varying magnetic field. The tester 10 can provide a plot of the output voltage as a function of a variation in the intensity of the magnetic field.

The bar 14 is supported by a tool 16 that locates the magnetic recording heads 12 within a gap 18 of a magnet 20. Wrapped around the magnet 20 is an excitation coil 22 that is connected to a magnetic driver circuit 24. The driver circuit 24 provides a current to the coil 22, which generates a magnetic field H that flows across the gap 18 and the heads 12. The magnet 20 has a length and permeability that provides a uniform magnetic field across the bar 14, so that each magnetic recording head 12 is exposed to the same magnetic field intensity. With a uniform magnetic field intensity the tester 10 can simultaneously test two or more magnetic recording heads 12. The driver circuit 24 is connected to a computer 26 which can vary the amplitude of the current provided to the coil 22.

FIGS. 3a–d show different waveforms generated by the computer 26 and the magnetic driver circuit 24. When operating within a hard disk drive, the field strength of the disk drive disk does not typically induce a substantial Faraday effect on the heads 12. Because of the size of the magnet 20 and the location of the heads within the magnetic field, the tester 10 may create a Faraday voltage that distorts the output of the heads 12. Faraday voltage is proportional to the time rate of change of the magnetic flux density. To compensate for the Faraday effect of the magnetic field on the heads 12, the computer 26 preferably provides a linearly varying waveform to the coil 22 and the magnetic heads 12. The linear waveform produces constant Faraday voltages which are substracted from the measured MR voltages of the head.

The linear waveform is to be distinguished from the sinusoidal waveforms used in the prior art. The subtraction of the Faraday voltage from the measured MR voltage may introduce a small timing error. The voltage error is proportional to the time derivative of the Faraday voltage. The second time derivative of a sinusoidal waveform is a sine wave. A sinusoidal waveform will therefore produce a sinusoidal error. The second time derivative of the linear waveform is zero, except at the peaks which are typically disregarded in MR head testing. The linear waveform introduces no timing errors. The tester 10 may create the sawtooth waveforms shown in FIGS. 3a and 3c, or clipped sawtooth waveforms shown in FIG. 3b and 3d. The clipped waveforms allow the Faraday voltage to return to zero at the peak amplitudes of the magnetic field. Although clipped and unclipped sawtooth waveforms are shown and described, it is to be understood that the computer 26 and driver circuit 24 may provide any programmable, or fixed, arbitrary waveform.

The tester 10 includes a sensor 28 that is located within the gap 18 to measure the strength of the magnetic field flowing across the heads 12. By way of example, the sensor 28 may be a hall sensor. The sensor 28 is located in a location within the gap 18 that has the same magnetic field intensity as the magnetic field that flows across the heads 12 so that the sensor 28 senses the same magnetic field amplitude as the recording heads. The tester 10 can be calibrated to insure that the magnetic field at the heads and the sensor are the same.

Referring to FIG. 2, the sensor 28 is coupled to a sensor circuit 30 which contains circuitry to both drive the sensor and measure the strength of the magnetic field. The output of the circuit 30 is provided to the computer 26. The computer 26 typically contains an analog to digital (A/D) converter and digital to analog (D/A) converter, respectively to receive data and provide commands to the other circuits of the tester 10.

The tester 10 includes a probe card 32 which contains a plurality of probe needles 34. The probe needles 34 are placed in contact with the contact pads 36 of the magnetic recording heads 12 to couple the heads to the tester 10. The probe card 32 is attached to a z-axis actuator 38 which can move the card 32 relative to the magnet 20 and the bar 14. The needles 34 are connected to an electrical tester circuit 40. The tester circuit 40 typically contains a programmable constant current source 42 which provides a constant current to the heads 12 through the needles 34. In the preferred embodiment, the tester circuit contains a pre-amplifier circuit 44 that is coupled to a precision resistor 46. The pre-amplifier circuit 44 amplifies the voltage across the resistor 46 and provides the amplified voltage to the computer 26. The heads 12 typically contain a magneto-resistive element which has a resistance that will vary with a changing magnetic field. The changing resistive values of the heads vary the voltage of the precision resistor 46. The voltage of the resistor 46 is amplified and provided to the computer. The computer can plot an output voltage versus magnetic field curve for each head 12.

The probe card 32 contains needles 34 that can be coupled to at least two magnetic recording heads. In the preferred embodiment, the probe card 32 has enough needles 34 to test every magnetic recording head in a bar of heads without moving the bar. The needles 34 may be coupled to the tester circuit 40 by a multiplexor 48 which multiplexes the circuit 40 to one of the heads 12. The computer 26 can control the multiplexor 48 so that each head is subsequently connected to the tester circuit 40 for a test routine. By way of example, the computer 26 may switch the multiplexor 48 to connect the tester circuit 40 to the first head 12 on the bar. A test routine is then performed on the first head. The computer 26 then switches the multiplexor 48 to a different input channel so that the next adjacent magnetic recording head is coupled to the tester circuit 40. The second head is tested and the computer 26 switches to the next channel. The cycle of switching channels and testing heads is repeated until all of the heads on the bar 14 are tested. Although a multiplexor 48 and a single tester circuit 40 is shown and described, it is to be understood that the tester may be constructed with multiple tester circuits, with or without a multiplexor. The multiple tester circuits would allow multiple heads to be tested simultaneously.

Referring to FIG. 1, the tester 10 preferably includes a bearing assembly 50 that allows the tool 16 to be rolled into and out of the magnet 20. The tool 16 may be coupled to an actuator 52 that pushes the heads 12 into the magnet gap 18. The tester 10 may have a second actuator (not shown), or a spring return, that pushes the tool 16 out of the magnet 20 when the actuator 52 is de-activated. The actuator(s) allows the heads 12 to be automatically loaded and unloaded from the magnet 20.

The tester 10 may also contain a vacuum pencil 54 that can move a bar or individual heads from a tray 56 to the tool 16. The vacuum pencil 54 is preferably coupled to an x-y table 58 and a z-actuator 60 which can accurately place the pencil 54 into the tray 56 and over the tool 16 to load and unload the bar, or individual heads. The position of the vacuum pencil 54 can be controlled by an operator through an input device (not shown) such as a joystick. The vacuum pencil 54 captures the bar/heads while minimizing the probability of marking or otherwise damaging the devices.

Figure 4:
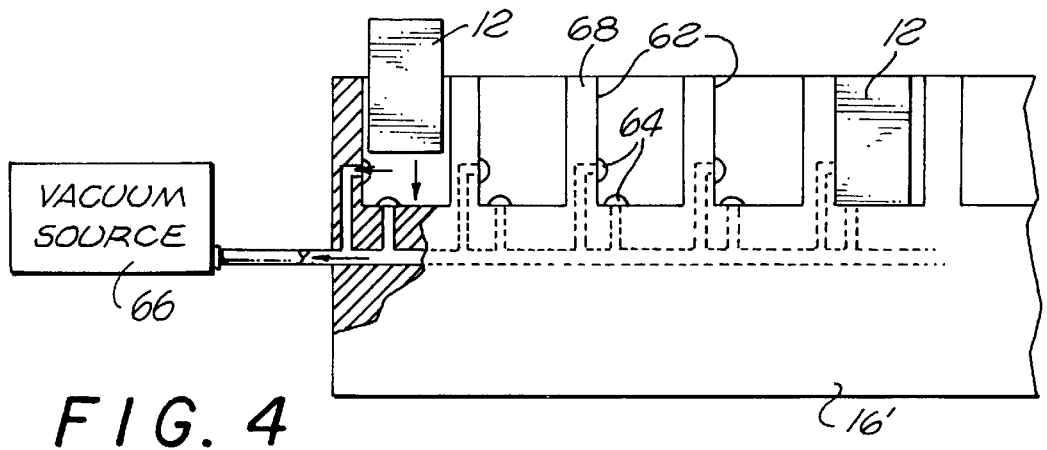
FIG. 4 is a top view of an alternate embodiment of a tool of the tester.

FIG. 4 shows an alternate embodiment of a tool 16' that can support a number of individual magnetic recording heads 12. It is sometimes desirable to test the heads individually even after testing in bar form. The tool 16' has a plurality of grooves 62 that each hold an individual head component. Each groove 62 preferably contains a pair of apertures 64 that are coupled to a vacuum source 66. The vacuum source creates an air flow that pulls the heads into the grooves 62. The pull of the vacuum source insures that the corners of the magnetic recording heads 12 are accurately located at the corners of the grooves 62, so that the probe needles 34 make contact with the contact pads 36 of the heads 12. There is preferably an aperture at each axis of the groove corner to insure contact between the heads and each side of the grooves. The grooves 62 are preferably separated by a section 68 that has a width which allows the same probe card 32 to be used for either the bar tool 16 or the individual head tool 16'. The tools are preferably constructed from a material that is hard enough to withstand the constant striking of the heads with the corners of the grooves.

Figure 5:
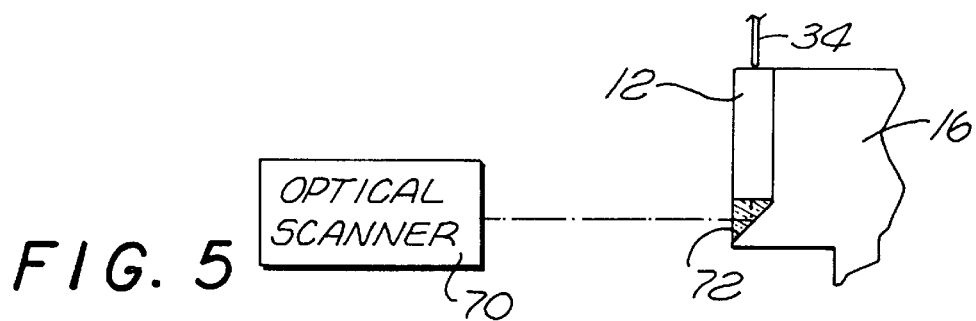
FIG. 5 is a side view showing a magnetic recording head coupled to an optical scanner.

FIG. 5 shows an alternate embodiment of a tester which contains an optical scanner 70. The magnetic recording heads 12 are typically manufactured with a serial number on the side of the die opposite from the contact pads of the heads 12. It is desirable to read the serial number to accurately correlate the test data with the head being tested. In one embodiment, the tool 16 is constructed from a transparent material that allows the serial numbers to be optically scanned while the heads are electrically tested. To minimize space, the tool 16 may contain prisms 72 which allow the optical scanner 70 to be placed at a right angle relative to the serial numbers of the heads. The heads 12 can be scanned during a magnetic test routine to minimize the test cycle. Although a prism 72 is shown and described, it is to be understood that the scanner 70 can read the serial number directly through a transparent portion of the tool without a prism.

In operation, the tool 16 is initially located out of the magnet 20. The vacuum pencil 54 automatically moves a bar 14 into the tool 16. By way of example, the testing of a bar will be described, although it is to be understood that the same routine may be applied to test a number of individual heads 12. After loading the bar 14 into the tool 16, the actuator 52 is activated to push the heads 12 into the gap 18 of the magnet 20. The probe card 32 is then moved in a downward direction so that the needles 34 are in contact with the contact pads 36 of the heads 12. The tester 10 may undergo an initialization routine to calibrate the various circuits. By way of example, the computer 26 may vary the current generated by the current source to obtain a desired calibrated reading.

The computer switches the multiplexor 48 to couple one of the heads to the tester circuit 40. The computer 26 then provides commands to apply and vary the magnetic field generated by the magnetic driver circuit 24, coil 22 and magnet 20. The computer 26 may obtain multiple samples of head output voltage data and magnetic field intensity, and then average the data to minimize any noise in the test.

Figure 6:
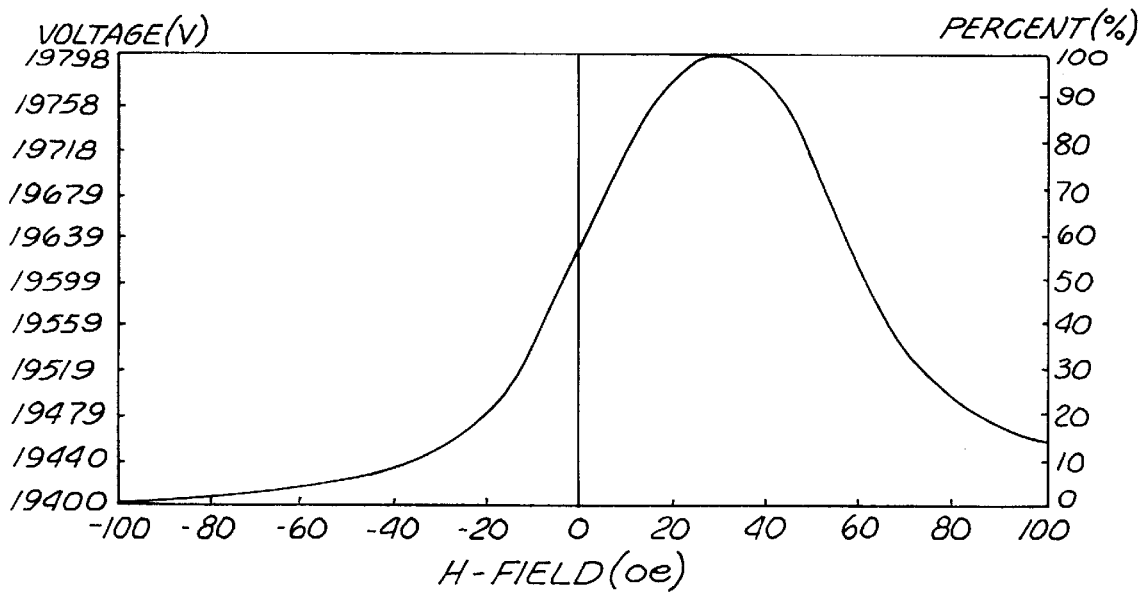
FIG. 6 is a graph showing a plot of voltage versus magnetic field for a magnetic recording head.

After the test cycle is completed the multiplexor 48 is switched to couple the next head to the tester circuit 40 and the test routine is repeated. The cycle of coupling heads and performing test routines may be conducted for each head of the bar. Simultaneous tests may be performed on a plurality of heads for a tester with multiple tester circuits 40. By placing the needles in contact with every head on the bar, the testing of all the heads can be completed electronically without spatially moving the bar, thereby greatly decreasing the cycle time required to test a bar of heads. The computer 26 accumulates the data and may plot a voltage versus magnetic field graph as shown in FIG. 6.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A test apparatus that test a plurality of magnetic recording heads, comprising:

a tool that holds the plurality of magnetic recording heads;

a magnetic field generating device that provides a magnetic field to each magnetic recording head, said magnetic field generating device including a core which has a gap;

a tester circuit that can sense a current in one of the magnetic recording heads;

a probe card that can simultaneously electrically couple said tester circuit to the magnetic recording heads and is located adjacent to said core;

a loader station where the plurality of magnetic recording heads are loaded onto said tool;

a bearing assembly that extends from said loader station to said magnetic field generating device, said bearing assembly supports said tool; and, an actuator that moves said tool along said bearing assembly from said loader station and into said gap of said magnetic field generating device.

2. The test apparatus as recited in claim 1, further comprising a magnetic driver circuit that is coupled to said magnetic device wherein said magnetic driver circuit provides a linearly varying magnetic drive current to said magnetic device.

3. The test apparatus as recited in claim 1, wherein said tool has a groove and an aperture coupled to a vacuum source that creates an air flow from said groove to said aperture, wherein the air flow will align a magnetic recording head placed within said groove.

4. The test apparatus as recited in claim 1, further comprising an optical scanner that is optically coupled to a transparent portion of said tool to sense an indicia located on the magnetic recording head.

5. The test apparatus as recited in claim 1, wherein said loader station includes a vacuum pencil that captures a magnetic recording head to transfer the magnetic recording head from a tray to said tool.

6. The test apparatus as recited in claim 1, wherein said tester circuit is coupled to said probe card by a multiplexor.

\* \* \* \* \*